United States Patent [19]

Misono et al.

[11] Patent Number: 4,782,352
[45] Date of Patent: Nov. 1, 1988

[54] CAPSULE RUPTURE PRINTING SYSTEM

[75] Inventors: Shigemi Misono; Tomoyuki Torii; Katsuhiro Konno, all of Tokyo, Japan

[73] Assignee: Seiko Instruments Inc., Tokyo, Japan

[21] Appl. No.: 102,419

[22] Filed: Sep. 29, 1987

[30] Foreign Application Priority Data

Sep. 30, 1986 [JP] Japan ................................. 61-232485
Sep. 30, 1986 [JP] Japan ................................. 61-232486

[51] Int. Cl.$^4$ ............................................. G01D 15/00
[52] U.S. Cl. ................... 346/160.1; 400/241.2
[58] Field of Search ................. 346/153.1, 160.1, 157; 430/138, 211; 355/3 R, 3 PP, 14 P; 400/202.3, 202.4, 202.2, 241.2

[56] References Cited

U.S. PATENT DOCUMENTS

| | | | |
|---|---|---|---|
| 4,205,322 | 5/1980 | Tsuzuki et al. | 346/160.1 |
| 4,399,209 | 8/1983 | Sanders et al. | 430/138 |
| 4,440,846 | 4/1984 | Sanders et al. | 430/138 |
| 4,723,137 | 2/1988 | Playe | 346/160.1 |

FOREIGN PATENT DOCUMENTS

2113860 11/1985 United Kingdom .

Primary Examiner—Arthur G. Evans
Attorney, Agent, or Firm—Bruce L. Adams; Van C. Wilks

[57] ABSTRACT

An apparatus is provided for use in color printing systems wherein an image is projected by a plurality of monochrome pictures corresponding to the pictures separated into three primary colors onto an imaging sheet which contains in layers pressure rupturable capsules, each encapsulating a dye and a photosensitive composition. The plural monochrome pictures are made by a laser scanner unit on the surface of a photosensitive drum according to image information and are transferred from the surface of the photosensitive drum to a transparent film. The transparent film is moved between a light source unit and a projection lens unit to project the plural monochrome pictures onto the imaging sheet.

4 Claims, 3 Drawing Sheets

CAPSULE RUPTURE PRINTING SYSTEM

BACKGROUND OF THE INVENTION

This invention relates to a capsule rupture printing system for recording an image in an image-receiving sheet with a layer of subminiature capsules. U.S. Pat. Nos. 4,399,209 and 4,440,846 and U.K. Pat. No. GB2,113,860 to The Mead Corporation describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. An image-forming agent such as a substantially colorless chromogenic materials are typically associated with the microcapsules such that when the microcapsules rupture the chromogenic materials are able to image-wise react with a developer material and produce a color image.

When this imaging system is used in an image output device of a computer, the photosensitive layer is exposed by photo signals which are converted from output electrical signals of the computer. In this case, however, scanning of an image from one end thereof to the other end takes certain time. The drawback of this system is that, especially in case many copies of the same one image are required, the time required for the scannings increases in propotion to the required numbers of the copies. Alternatively, output electrical signals of the computer are applied to a liquid crystal display to form a "temporal" image thereon. In this case the photosensitive layer is exposed by the light reflected from or transmitted through the temporal image. However, in economical consideration, only a small size line-shaped liquid crystal display is currently practical. When an image is formed on the photosensitive layer, the line-shaped liquid crystal is scanned from one end thereof to the other end. Therefore, this system presents the same problem as abovementioned, where the scanning time increases in propotion to the increased numbers of copies of an image.

SUMMARY OF THE INVENTION

An object and advantage of the present invention is to provide a novel color printing system which can increase the speed of printing many copies of the same one image.

Another object of the present invention is to provide a novel color printing system which includes a means for making a plurality of large size monocrome pictures which are converted from output electrical signals of the computer and used for image original.

The above and other related objects and features of the invention will be apparent from a reading of the following description of the disclosure found in the accompanying drawings and the novelty thereof pointed out in the appended claims.

DESCRIPTION OF THE PREFERRED EMBODIMENT

Figure 3:
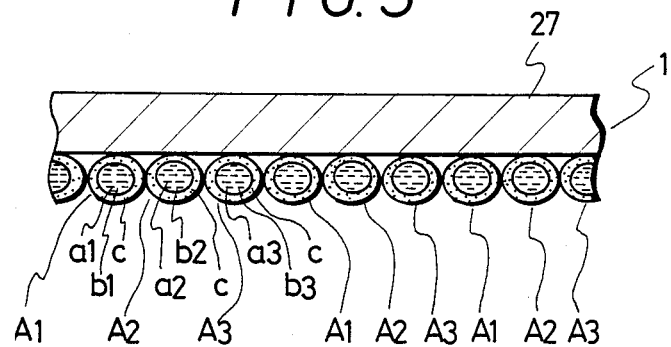
FIG. 3 is a sectional view of the imaging sheet used in the present invention.
Figure 5:
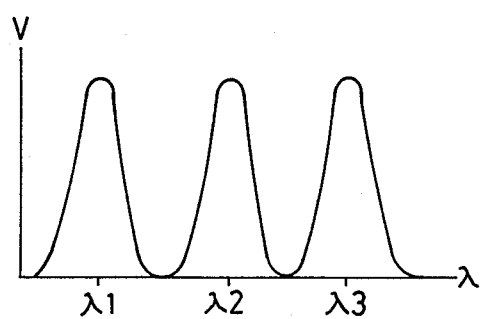
FIG. 5 is an explanatory view showing the sensitive spectral of the imaging sheet.

First, the principle of the present invention is explained:

FIG. 3 shows a simplified structure of the imaging sheet used in this invention. Reference symbols $A_1$, $A_2$, $A_3$ denote microcapsules presenting colors of cyan, magenta and yellow, respectively. Chromogenic materials $a_1$, $a_2$, $a_3$ which generate cyan, magenta and yellow, respectively, and reactive composition $b_1$, $b_2$, $b_3$ which immobilize the chromogenic materials by changing the viscosity etc. as a result of reaction to electromagnetic beams of which wave-lengths $\lambda_1$, $\lambda_2$, $\lambda_3$ correspond to the colors of the chromogenic materials (see FIG. 5) such as light beams, are microcapsulated by surrounding thin films C made of gelatin etc. The microcapsules are coated evenly on the surface of the sheet 27 forming carrier so as to constitute an imaging sheet 1.

Figure 4:
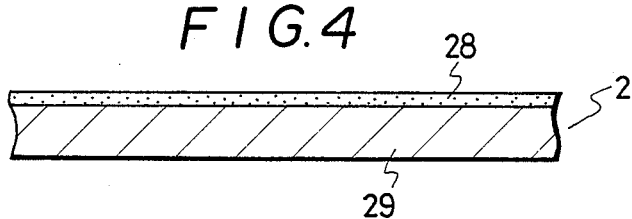
FIG. 4 is a sectional view of the image-receiving sheet used in the present invention.

FIG. 4 denotes an image-receiving sheet 2 to be used with the imaging sheet 1. It is constituted by coating a developing material 28, which generates colors in response to the chromogenic materials $a_1$, $a_2$, $a_3$, on the surface of a sheet 29 forming carrier.

When the above mentioned imaging sheet 1 is exposed to the light having the wave-lengths to which the reactive composition $b_1$, $b_2$, $b_3$ within the microcapsules $A_1$, $A_2$, $A_3$ react, the viscosity of the reactive composition $b_1$, $b_2$, $b_3$ changes. Then, the imaging sheet 1, thus exposed, is united with the image-receiving sheet 2 into one body and pressure is added to the united body so that the capsules $A_1$, $A_2$, $A_3$ are broken. As a result, there comes out a difference in the amount of the chromogenic materials flown out of the capsules between the capsules exposed to light and those unexposed. Consequently, colors corresponding to the wave lengths $\lambda_1$, $\lambda_2$, $\lambda_3$ of the projecting light are presented on the image-receiving sheet 2. That is, color patterns in accordance with the patterns presented at the time of light projection can be obtained.

Figure 1:
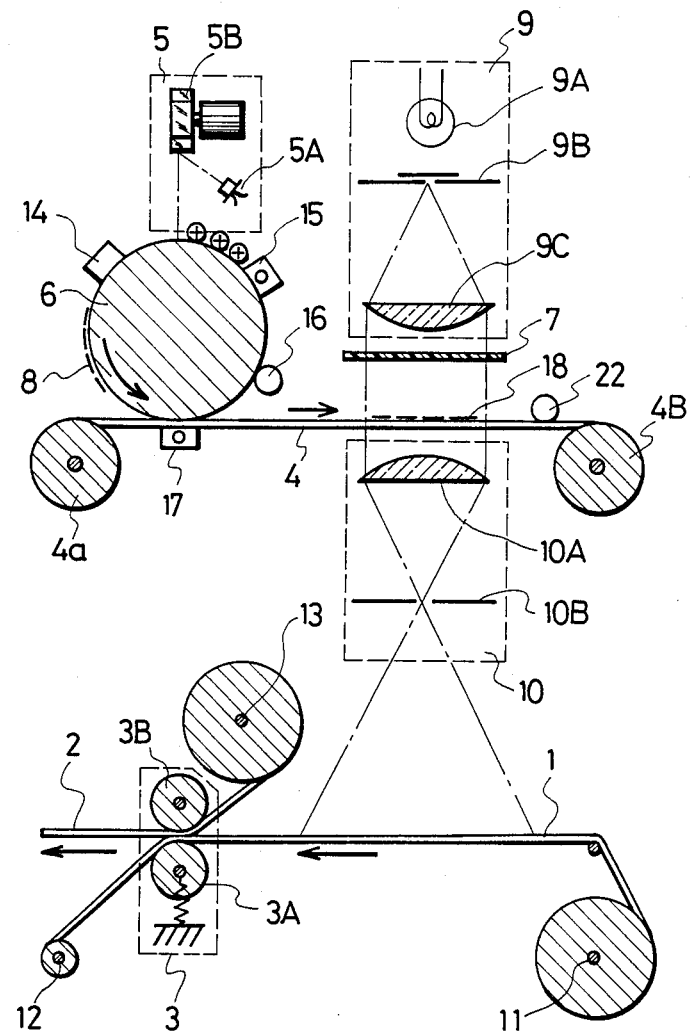
FIG. 1 is a system construction representing one embodiment of the present invention.

FIG. 1 shows one embodiment of the present invention.

Microcapsules sealing therein a photo-reactive composition and a chromogenic materials which generates a color upon reaction with a developing materials applied on an image-receiving sheet 2 are applied on an imaging sheet 1. Back-tension is applied to this imaging sheet 1 by rollers 11 in order to form a flat surface portion onto which a later-described image original is to be projected. Furthermore, a pressure roller unit 3 is disposed downstream of the flat surface portion, and while the photosensitive surface of the imaging sheet and the developing materials-coated surface of the image-receiving sheet 2 face each other in superposition, the microcapsules are ruptured, color generation proceeds and an image or the like is outputted. Reference numeral 4 represents a transparent film subjected to treatment for providing a film such as PET film with uniform chargeability.

A charging device 15 is disposed in the outer periphery of a photosensitive drum 6 to charge the surface of the photosensitive drum positively. Reference numeral 5 represents a laser scanner unit, which radiates a laser beam on the surface of the photosensitive drum 6 on the basis of output signals of an image data processing circuit or output signals of a computer, not shown, to remove the charged charge and to form the latent image of the image. Then, a toner is deposited to the charge removal portion by a developing unit 14 to form a toner image. The toner image thus formed on the surface of the photosensitive drum 6 moves in synchronism with revolution of the photosensitive drum 6 and is transferred onto the transparent film 4 by an adsorption unit 17 which is charged negatively. The surface of the photosensitive drum 6 is cleaned by a cleaning unit 16 to prepare for next image recording. The transparent film 4 on which the original image is transferred stops between a light source unit 9 consisting of a light source 9A, a shutter-diaphragm 9B and a condenser lens 9C and a projection unit 10 consisting of a condenser lens 10A and a diaphragm 10B disposed at the same position as the light source unit 9 so that an optimal quantity of light is projected to the imaging sheet 1. After projection is completed, the original image is cleaned off from the transparent film 4 by a cleaning roller 22 and the transparent film 4 is taken up on a reel 4B. When the transparent film 4 is fully used up, it is rewound on the reel 4A for re-use.

Next, a method for color image recording will be described. The image of each of yellow, cyan and magenta is formed on the film separately by the method described above. Color filters for yellow, cyan and magenta are disposed in the color filter 7 and are sequentially moved by driving means, not shown, to make color separation of the light projected from the light source unit 9. The light source unit 9 projects the original image light once per each color corresponding to each color of the color filter 7 to the imaging sheet 1. Thus, the three colors of yellow, cyan and magenta are projected to the imaging sheet 1 for color recording. Incidentally, it is of course possible to utilize a light modulator such as liquid crystal shutter or a PLZT shutter, in place of the laser scanner unit 5 described above.

Figure 2:
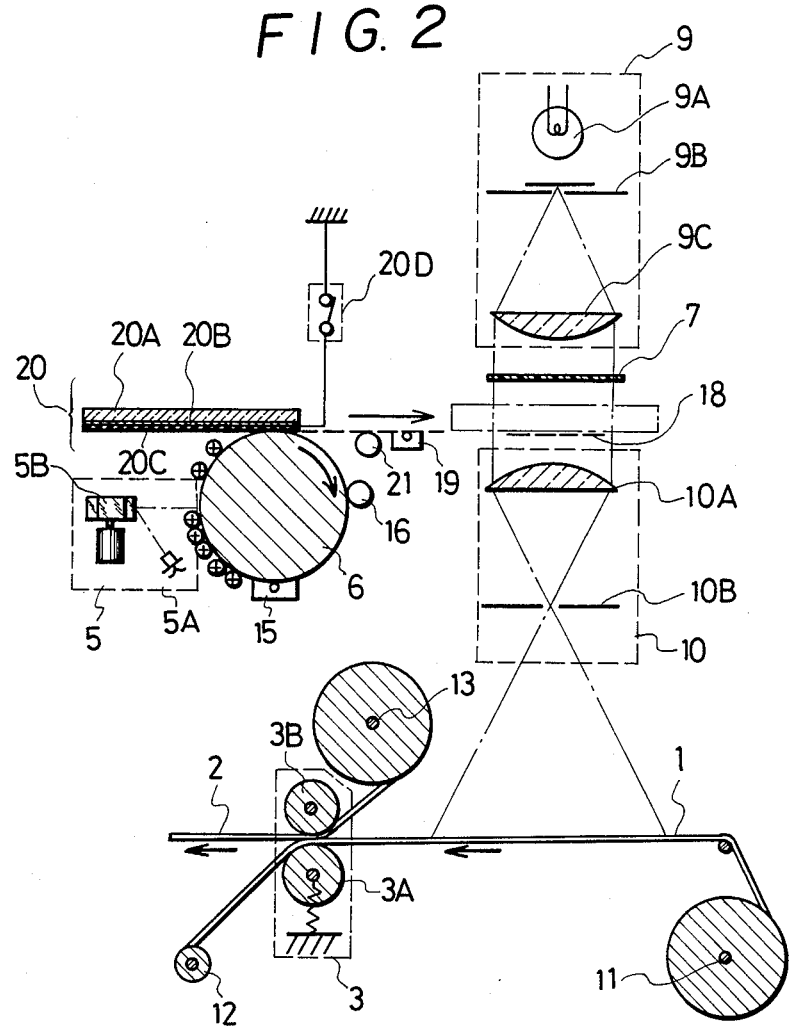
FIG. 2 is a system construction representing another embodiment of the present invention.

FIG. 2 shows the second embodiment of the present invention.

Microcapsules sealing therein a photo-reactive composition and a chromogenic materials which generates color upon reaction with a developing materials applied on an image-receiving sheet 2 are applied on an imaging sheet 1. Back-tension is applied to the imaging sheet 1 by rollers 11 to form a flat surface portion onto which a later-described original image is to be projected. Further, a pressure roller unit 3 is disposed downstream of this flat surface portion. While the photo-sensitive surface of the imaging sheet 1 and the developing materials-coated surface of the image-receiving sheet 2 face each other in superposition, the microcapsules are ruptured, react with the developing materials so that coloration proceeds and a color is outputted.

Reference numeral 6 represents a photosensitive drum, whose surface is charged positively or negatively by the charging device 15 disposed in its outer periphery.

Under this state, a laser beam is radiated by the laser scanner unit 5 on the basis of signals from an image data processing circuit or output signals of a computer, not shown, and the charge of the laser beam radiated portion is removed so as to form the latent image of the image. The latent image formed on the photosensitive drum is transferred onto a transfer unit 20, which is in point-contact with the outer periphery of the photosensitive drum 6, consisting of a glass substrate 20A, a transparent Nesa film 20B and a dielectric film 20C. In other words, the residual charge on the drum is transferred onto the dielectric film 20C. After transfer is completed, the surface of the photo-sensitive drum 6 is cleaned by a cleaning unit 16 to prepare for next image recording. A toner is then deposited by a developing unit 19 to the transfer unit 20 to which the latent image is transferred. After the original image developed by the toner is thus formed, the transfer unit 20 is moved between a light source unit 9 and a projection lens unit 10. At this time the cleaning device 21 is away from the transfer unit by mechanical means such as cams. The light source unit 9 consists of a lamp 9A, a shutter-diaphragm 9B and a condenser lens 9C. The projection lens unit 10 consists of a condenser lens 10A, and a diaphragm 10B and projects the light from the light source unit 9 passing through the transfer unit 20 by adjusting the distance from the imaging sheet 1 by vertically moving the position of the projection lens unit 10, and expands or reduces the original image projected onto the imaging sheet 1. After projection of the original image to the imaging sheet 1 is complete, a switch 20D connected to the transparent Nesa film 20B is turned on to set the potential level of the dielectric film 20C to an equal level to the ground level and while the deposition power of the toner image that is the original image is thus reduced, the transfer surface of the transfer unit 20 is cleaned by the cleaning device 21 to prepare for next image recording.

Next, recording of a color image will be described. Three transfer units 20, to which the original images corresponding to the yellow, cyan and magenta three colors are moved sequentially between the light source unit 9 and the projection unit 10 and under this state, color filters having yellow, cyan and magenta three color filters are sequentially moved in synchronism with the transfer units 20 by driving means, not shown, in order to continuously project the light passing through the tree color filters onto the imaging sheet 1.

Diaphragm and shutter time are regulated for each filter so that the light which permits the microcapsules to cause the most efficient coloring reaction is projected to the imaging sheet 1. In this manner, high quality color image recording is carried out.

Although the description given above represents the case where the electrostatic latent image is transferred from the photosensitive drum 6 to the transfer unit 20, it is of course possible to transfer the toner image.

As described above, the present invention can easily form the plural and large size monocrome pictures which are converted from output signals of the computer and used for image original. The utilization of the image original does not require the scanning time increasing in propotion to the increased numbers of copies of an image, so that the color printing system of the present invention can make continuous recording and high speed recording by a simple mechanism.

What is claimed is:
1. An apparatus for forming an image on an image-receiving sheet, comprising:
   an imaging sheet coated with microcapsules sealing therein a photo-reactive composition and a chromogenic materials;
   a laser scanner unit for forming a plurality of latent images corresponding to the images separated into three primary colors on the surface of a photosensitive drum according to image information;
a developing unit for developing the latent images on the surface of said photosensitive drum as toner images;
a film transferred said toner image from the surface of said photosensitive drum for projecting said toner images onto said imaging sheet by being interposed between a light source unit and a projection unit; and
means for pressing said imaging sheet and said image-receiving sheet with said capsules coating face of said imaging sheet facing said image-receiving sheet, so the layer of capsules lies sandwiched between said sheets.

2. The apparatus described in claim 1, wherein:
said toner images on said film are projected through each of yellow, cyan and magenta filters onto said imaging sheet.

3. An apparatus for forming an image on an image-receiving sheet, comprising:
an imaging sheet coated with microcapsules sealing therein a photo-reactive composition and a chromogenic materials;
a laser scanner unit for forming a plurality of latent images corresponding to the images separated into three primary colors on the surface of a photosensitive drum according to image information;
a transfer unit having a dielectric film for receiving said latent images from the surface of said photosensitive drum, being developed by a developing unit and being interposed between a light source unit and a projection unit to project the developed images onto said imaging sheet; and
means for pressing said imaging sheet and said image-receiving sheet with said capsules coating face of said imaging sheet facing said image-receiving sheet, so the layer of capsules lies sandwiched between said sheets.

4. The apparatus described in claim 3, wherein:
said developed images on the transfer unit are projected through each of yellow, cyan and magenta filters onto said imaging sheet.

* * * * *